United States Patent
Gatzke

(10) Patent No.: US 9,318,625 B2
(45) Date of Patent: Apr. 19, 2016

(54) SUPPLEMENTARY POWER SUPPLY FOR VEHICLES, IN PARTICULAR AIRCRAFT

(75) Inventor: Sten Gatzke, Emtinghausen (DE)

(73) Assignee: Airbus Operations GmbH, Hamburg (DE)

(*) Notice: Subject to any disclaimer, the term of this patent is extended or adjusted under 35 U.S.C. 154(b) by 817 days.

(21) Appl. No.: 13/536,562

(22) Filed: Jun. 28, 2012

(65) Prior Publication Data

US 2013/0002015 A1    Jan. 3, 2013

Related U.S. Application Data

(60) Provisional application No. 61/502,354, filed on Jun. 29, 2011.

(30) Foreign Application Priority Data

Jun. 29, 2011 (DE) .................. 10 2011 105 922

(51) Int. Cl.
| | |
|---|---|
| *B60L 1/00* | (2006.01) |
| *H01L 31/02* | (2006.01) |
| *B64D 41/00* | (2006.01) |
| *H02S 10/40* | (2014.01) |
| *B60K 16/00* | (2006.01) |

(52) U.S. Cl.
CPC .......... *H01L 31/02021* (2013.01); *B64D 41/00* (2013.01); *H02S 10/40* (2014.12); *B60K 2016/003* (2013.01); *B64D 2211/00* (2013.01); *Y02E 10/50* (2013.01); *Y02T 50/54* (2013.01)

(58) Field of Classification Search
CPC ..................... B64D 2211/00; H01L 31/02021; B60K 2016/003
See application file for complete search history.

(56) References Cited

U.S. PATENT DOCUMENTS

| | | | |
|---|---|---|---|
| 2010/0250018 A1* | 9/2010 | Hauf | ....................... H02J 3/383 700/297 |
| 2013/0241294 A1* | 9/2013 | Cleland | ........................... 307/71 |

FOREIGN PATENT DOCUMENTS

DE    20 2008 010 208 U1    11/2008

OTHER PUBLICATIONS

Ragot, P.; Markovic, M.; Perriard, Y., "Optimization of electric motor for a solar airplane application," in Industry Applications, IEEE Transactions on, vol. 42, No. 4, pp. 1053-1061, Jul.-Aug. 2006.*

* cited by examiner

*Primary Examiner* — Daniel Cavallari
(74) *Attorney, Agent, or Firm* — Jenkins, Wilson, Taylor & Hunt, P.A.

(57) ABSTRACT

The invention relates to a supplementary power supply including a solar generator for ohmic consumers in a vehicle, in particular an aircraft, wherein a control circuit is electrically connected to a multiplicity of solar cells via generator terminals of the solar generator and includes at least one output terminal, and wherein the control circuit is configured to interconnect the at least one output terminal with the multiplicity of solar cells in accordance with an actual intensity of insolation of the solar cells such that a nominal voltage and/or a nominal current intensity is available at the at least one output terminal.

12 Claims, 3 Drawing Sheets

SUPPLEMENTARY POWER SUPPLY FOR VEHICLES, IN PARTICULAR AIRCRAFT

CROSS-REFERENCE TO RELATED APPLICATIONS

The present application claims priority from German Application DE 10 2011 105 922.2, filed on Jun. 29, 2011, and claims the benefit of U.S. Provisional application 61/502,354, filed on Jun. 29, 2011, each of which is hereby incorporated in its entirety by reference.

FIELD OF THE INVENTION

The present invention generally relates to self-sufficient power supply systems for vehicles, in particular for aircraft, for use on the ground, in flight, or during emergency operation. In particular the present invention concerns efficient utilization of electric power furnished by means of a solar generator as a supplementary power supply by ohmic consumers in a vehicle, in particular in an aircraft.

BACKGROUND

On account of their desired mobility, vehicles customarily require self-sufficient supply means in order to furnish electric power, independently of the outside, for the onboard electric consumer systems, i.e. for ohmic consumer systems.

At present it is customary for aircraft to furnish the power required by electric onboard systems with the aid of an auxiliary power unit (APU) while on the ground. In flight operation, this is predominantly achieved with the aid of generators integrated in the engines of the aircraft.

Solar-driven aircraft have already been developed, built, and flown. A good overview in this regard may be found in Hannes Ross et al., in "Solarangetriebene Flugzeuge=The True All Electric Aircraft, Eine Übersicht", published on the CD-ROM of the DGLR for "Deutscher Luft- and Raumfahrtkongress 2007, Frist CEAS European Air and Space Conference, Century Perspectives, 10-13 Sep. 2007" in Berlin and available in the Internet at http://hamburg.dglr.de. In the known solar planes, the current generated by solar cells on the airfoils is utilized for driving the aircraft. This does not give rise to the question of an alternative use of the solar current in the form of energy management.

In principle, solar cells on an aircraft might be utilized in addition to or as a substitute for the aircraft's APU. For example, owing to local noise and exhaust gas regulations, the use of the APU on the ground is partly restricted. In such cases the demand of electric power is hitherto being met by means of a ground power unit (GPU) or air starter unit (ASU) that is present externally of the aircraft. A GPU or an ASU is moreover employed when the battery in the APU of the aircraft is exhausted so that it is not possible to start the APU of the aircraft.

In the case of aircraft that are to meet a particular requirement profile of the ETOPS (Extended-range Twin-engine Operation Performance Standard) it is mandatory for certain flight routes to add on the APU in flight operation so as to ensure a sufficient supply of electric current for the case that an engine and thus the generators integrated therein should fail. Here, too, the APU might possibly be substituted or supported by a solar generator.

When an aircraft having left the parking position still has to wait on a taxiway of an airport for an extended time period because the runway is closed, e.g. due to an incident, it is frequently necessary particularly in the case of long-haul aircraft to request a GPU as well as an air conditioning truck, for without the power supply from the generators driven by the running engines it is not possible to guarantee sufficient air conditioning of the aircraft's cabin. Here, too, the energy balance of the aircraft might be assisted by solar energy.

However, the amount of power that may be furnished on the part of the solar cells is directly dependent on the actual irradiation intensity. It is therefore not possible, even in the case of long-haul aircraft having large outer surfaces for arranging solar cells, to always warrant that a sufficient amount of solar current may be generated. It is therefore of interest to utilize the power available from respective solar cells with as little loss as possible.

SUMMARY

Various embodiments of the present invention improve the efficiency of utilization of the electric power generated by means of a solar generator as a supplementary power supply in electric systems of an aircraft.

According to a first aspect of various embodiments of the invention, in a vehicle a solar generator is arranged on or in the outer surface, in particular preferably on the fuselage surface in the case of an aircraft. In accordance with various embodiments of the invention it is proposed to implement the solar generator in such a way that the output voltage and/or the output current may at any point of time be reconfigured in certain steps in correspondence to the actual intensity of irradiation with light, so as to fundamentally always be able to directly furnish an output voltage for supplying a particular voltage-compatible onboard system of the aircraft whose actual current demand may also be covered at the current irradiation intensity. In other words, an inverter or additional converters for the provision and/or stabilization of the output voltage may be dimensioned smaller or omitted altogether.

A supplementary power supply including a solar generator for ohmic consumers in a vehicle, in particular aircraft, is proposed in accordance with a first aspect of various embodiments of the invention.

In accordance with a first embodiment a control circuit is electrically connected to a multiplicity of solar cells via generator terminals of the solar generator and includes at least one output terminal. The control circuit is configured to interconnect the at least one output terminal with the multiplicity of solar cells of the solar generator in accordance with an actual intensity of insolation of the solar cells such that a nominal voltage and in particular a nominal current is available at the at least one output terminal.

Various embodiments of the invention also relate to a method for selectively furnishing a predetermined voltage by means of a multiplicity of solar cells on an output terminal.

The method in accordance with various embodiments of the invention essentially provides the same advantages as the supplementary power supply in accordance with various embodiments of the invention and includes at least the following steps: interconnecting the solar cells by means of at least two electric terminals each to form a solar generator; configuring several ones of the electric terminals as generator terminals of the solar generator for one or several predetermined voltages between one respective pair each of the generator terminals; connecting the at least one output terminal to as many pairs of the generator terminals having the predetermined voltage present between them, that the predetermined voltage and a predetermined nominal current are available at the output terminal.

To the end of forming the solar generator, each solar cell from among the multiplicity of solar cells may each include at least two electric terminals. Several ones of the electric terminals may then be configured as the generator terminals for one or several predetermined voltages between two respective ones of these generator terminals. In this regard, respective groups of the solar cells may be connected among each other by means of the electric terminals so as to form one or several units, in particular solar panels and/or solar modules, for a predetermined output voltage. The generator terminals are then connected to at least a part of the electric terminals of the one or several unit(s) constituted thereby, respectively.

In one embodiment the control circuit is configured to selectively connect at least two of the generator terminals of the solar generator to at least two input terminals. In other words, the connection of the control circuit to the generator terminals is flexible and may be altered or switched accordingly upon demand. Alternatively, the control circuit may be also be fixedly connected or interconnected with the generator terminals via respective associated input terminals.

The at least one output terminal of the control circuit may be fixedly connected or adapted to be selectively connected to a particular consumer system of the vehicle. The consumer system is characterized by a respective, specific nominal voltage and a specific nominal current, in particular one corresponding to a momentary rate of utilization of the consumer system.

In order to be able to furnish the nominal voltage that is required in accordance with the consumer system to be supplied at the at least one output terminal, the control circuit is configured to interconnect the at least one output terminal with the multiplicity of solar cells of the solar generator in correspondence with the actual intensity of insolation of the solar cells, i.e., under consideration of the actual insolation intensity, in that the at least one output terminal is interconnected with at least two of the generator terminals such as to enable the generation of the required nominal current.

In a particular embodiment the control circuit is further configured to only draw such a nominal voltage at the solar generator for which the respective required nominal current can be generated at the actual intensity of insolation of the solar cells.

In a further development of the particular embodiment, at least one control input, in particular a bidirectional control bus, is furthermore provided on the control circuit. By means of the control input or control bus the at least one output terminal may be activated, or connected to particular consumer systems only, in accordance with a priority specification.

The priority specification may be such that based on a current operating condition of the vehicle, the at least one consumer system is selectable only if it belongs to a set, predetermined functional group. This enables the allocation of the consumer systems to certain functional groups—e.g., in the case of an aircraft in accordance with the operating condition such as in flight, on the ground, or in an emergency or the like—in correspondence to the respective rank. As a result, the electric power furnished by the solar generator may be channelled according to demand and utilized efficiently.

In accordance with a second aspect of various embodiments of the invention, the solar generator is arranged at least on or in a part of the outer surface of an aircraft. The aircraft conventionally includes an aircraft fuselage having at least one fuselage portion and a fuselage surface. Here the at least one solar generator may be arranged on the fuselage surface or integrated in the fuselage surface at least in the area, in particular in a predetermined sector angle, of the back of the aircraft.

One important difference from previously known solar aircraft particularly resides in the fact that solar cells were in the prior art arranged only on the airfoils of an aircraft in order to operate a drive system of the aircraft with electric power from these solar cells as a main power supply. It was previously not considered to arrange solar cells on the fuselage of an aircraft and use them as a supplement or substitute for the APU of the aircraft. In other words, an important innovation consists in the integration of a supplementary power supply having the form of a solar generator on or in the fuselage shell of the aircraft. I.e., the outer skin or shell of the fuselage of an aircraft is supplemented with a functional electricity generation layer by means of an outer laminate layer including solar cells. Hereby it is possible to unite two functions in the fuselage shell, namely, the original static structural function, and additionally as an innovation a power generation function.

In the case of an aircraft, the consumer systems may be at least one from the group of: fuel management, primary flight control, secondary flight control, braking systems, toilets and onboard kitchens, cabin air conditioning, and the like. The nominal voltages may accordingly be voltage from the group of: 28 V, 115 V, 230 V, etc.

Besides the particularly efficient utilization of the electric power furnished by a solar generator as a supplementary power supply, the presently proposed supplementary power supply or method presents at least one of the following advantages: enhancing the independence of the aircraft of an external power supply on the ground; maintaining the charge condition of batteries of the aircraft such as, e.g., in the case of business jets, in cases of an extended stationary condition; corresponding prolongation of the service life of the aircraft's onboard APU and other active power generation systems, as well as an extension of the maintenance intervals of such systems; reduction of the fuel consumption by the proportion generated through ohmic loads, and the concurrent reduction of the $CO_2$/NOX emissions of the engines; possibly meeting a particular ETOPS profile without having to add on the APU of the aircraft in flight.

BRIEF DESCRIPTION OF THE DRAWINGS

Further advantageous aspects of the invention as well as practical examples in this regard shall be explained in more detail hereinbelow in conjunction with the annexed figures of the drawings. Parts or components having similar functions are partly provided with identical reference symbols. The terms "left", "right", "top", "bottom" as used in the description of the practical example relate to the figures of the drawings in an orientation where the designation of the figure and reference symbols can be read normally. In the drawings.

DESCRIPTION

Figure 1:
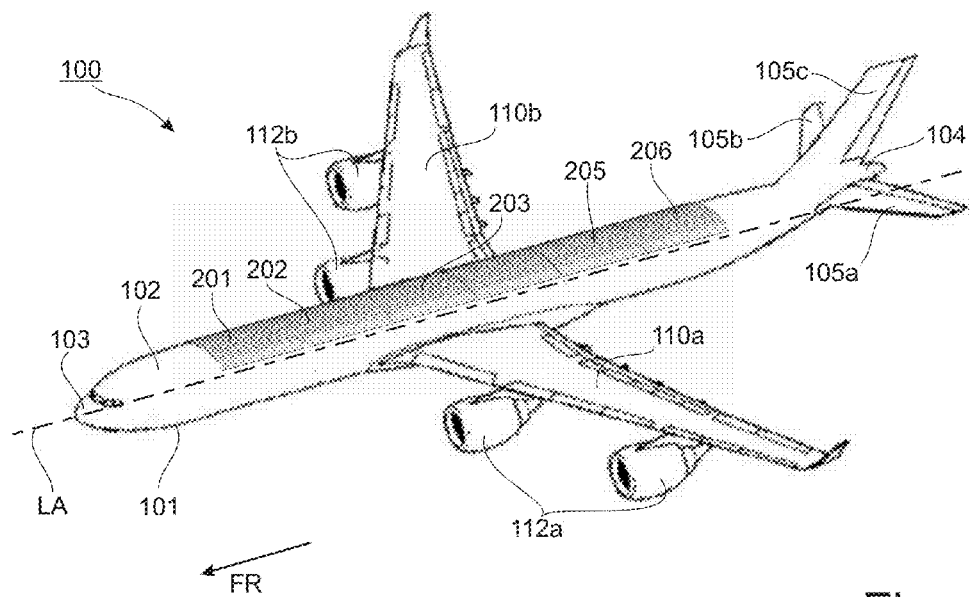
FIG. 1 is a perspective view of an aircraft including a solar generator as a supplementary power supply on the upper side of the fuselage in accordance with a practical example of the present invention.

FIG. 1 shows a perspective representation of an aircraft 100, for example an Airbus A340, which includes a supplementary power supply in the form solar cells contained in solar modules 201, 202, 203, 204, 205, 206.

The aircraft 100 includes an aircraft fuselage 101 having a fuselage surface 102 and a longitudinal axis LA, the direction of which substantially corresponds to the regular direction of flight FR of the aircraft 100. The front end of the aircraft fuselage 101 when viewed in the direction of flight FR is formed by an aircraft nose 103. At the rear end of the aircraft fuselage 101 there is the aircraft tail 104, in the area of which the tail assembly of the aircraft including two fins 105a and 105b with elevators arranged thereon as well as a fin 105c having a vertical rudder is arranged. Approximately in the middle of the aircraft fuselage 101 there are a right wing 110a and a left wing 110b on the left and on the right relative to the direction of flight FR. Under the wings 110a and 110b two respective right engines 112a and two respective left engines 112b are suspended.

In the upper area of the fuselage surface 102, or on the back of the aircraft fuselage 101, as it were, six solar modules 201 through 206 are arranged in the represented practical example, which are solar generators constituting a supplementary power supply in accordance with an embodiment of the invention for the aircraft 100 in addition to primary generators arranged, for instance, in the engines 112a, 112b, in addition to the APU, and in an emergency in addition to a ram air turbine (RAT).

Figure 2:
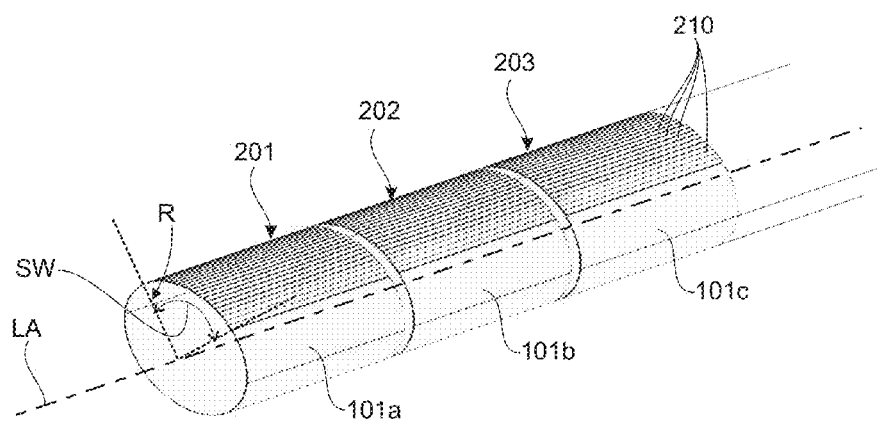
FIG. 2 is a schematic representation of three fuselage portions of the aircraft of FIG. 1, each having a solar module arranged in the upper segment for the supplementary power supply in accordance with an embodiment of the invention.

In a schematic representation for the sake of clarity, FIG. 2 shows three of fuselage portions 101a, 101b, 101c of the aircraft fuselage 101 of the aircraft 100 shown in FIG. 1 that are aligned on the longitudinal axis LA. On each one of the represented fuselage portions 101a, 101b, 101c there is a respective one of the solar modules 201, 202, 203.

The outer structure of each fuselage portion is basically tubular, with the fuselage surface 102 of the aircraft fuselage 101, particularly in the area of the solar modules 201, 202, 203, being approximately cylindrical, i.e., having a substantially regular curvature at least in this area. The fuselage surface covered by the respective solar module 201, 202, 203 of the respective fuselage portion 101a, 101b, 101c then corresponds to the jacket surface of a tube sector. In the case of an approximately cylindrical tube sector, the sector and thus also the sector jacket surface may be defined and specified by means of the radius R of the aircraft fuselage 101 in the sector and a sector angle SW. As is represented in FIG. 2, the circle center may be situated on the longitudinal axis LA but does not necessarily have to. In common aircraft types, for example of the manufacturer Airbus, a fuselage surface which may be specified by means of the radius R and a sector angle SW of about 70 to 80 degrees is accordingly available for the solar modules 201 through 206 on the back of the aircraft fuselage. In transport plane variants which mostly have no windows in the cargo hold area of the fuselage, sector angles of up to more than 180 degrees are also possible.

As may already be seen in FIG. 2, in the presently described practical example each of the solar modules 201, 202, 203 is composed of several solar panels 210. Each solar panel 210 contains a particular number of solar cells that are interconnected in a manner known per se for one or several output voltage(s) of a solar panel 210.

Each solar panel 210 has the shape of an elongate cylinder jacket sector portion and is arranged, with its longitudinal axis substantially in parallel with the longitudinal axis LA of the aircraft, on the surface of the respective fuselage portion 101a, 101b, 101c. Different geometrical shapes of the solar panels 210 are, of course, also possible.

In the presently described embodiment, the individual solar panels 210 contain thin-film solar cells formed on a suitable support material such as, e.g., a polyimide synthetic substrate. The thin-film solar cells may be, for example, CIS or CIGS thin-film solar cells that are based on a combination of the elements copper (Cu), indium (In), gallium (Ga), sulfur (S), and selenium (Se). Currently marketed solar cells of this kind including the necessary circuitry structures have a weight of approximately 260 g/m$^2$ and already attain efficiencies of about 20% and more. The thin-film solar cells may be manufactured in different colors, or even transparent. The latter offers the possibility of a virtually invisible solar generator on the outer surface of the aircraft.

In principle the output voltage that may be tapped from a single solar cell is a function of the semiconductor material used for the solar cells and is only slightly influenced by the insolation intensity, i.e., when irradiated, the terminal voltage rapidly rises to the quantity determined by the semiconductor material; in the case of silicon the terminal voltage is approximately 0.5 V.

A solar panel 210 thus has at any rate at least two electric terminal poles where a photoelectric voltage generated by several solar cells in the solar panel 210 may be tapped at a sufficient irradiation or insolation, wherein a current proportional to the actual insolation intensity or a maximum current corresponding to the current capacity of the solar panel 210 may be output at this output voltage (terminal voltage).

For a particular output voltage at the at least two electric terminal poles a corresponding number of solar cells is thus already connected in series in the solar panel 210. For a particular output current at a particular insolation intensity a corresponding number of solar cells is connected in parallel in the solar panel 210. The solar panel 210 may be configured such that the required output current is generated by the solar panel 210 even at a lower insolation intensity. In other words, a solar panel 210 is a unit containing a group of solar cells that are interconnected, for example monolithically, in a suitable combination of the connection variants of parallel connection and series connection, in order to be able to furnish a predetermined open circuit voltage, or a particular short-circuit current, at a corresponding irradiation.

In the practical example, adjacent solar panels 210 are mechanically connected and electrically interconnected so as to form a solar module 201, 202, 203. It is also possible for each solar panel 210 by itself to be interconnected into the supplementary power supply only upon demand and in correspondence to the actual insolation intensity, i.e. the available amount of sunlight or moonlight (i.e., sunlight reflected at the moon), in a manner that will be explained further on. In other words, like the solar cells in a solar panel 210 several solar panels 210 are connected correspondingly to form a solar module 201, 202, 203 of the solar generator. A plurality of solar panels 210 thus form a respective solar module 201, 202, 203.

Solar modules of adjacent fuselage portions 101a, 101b, 101c may also be connected to each other mechanically and/or electrically, so that the individual solar modules 201, 202, 203 form a single, large solar generator on the back of the aircraft fuselage 101.

In the represented embodiment, combined contacting and fastening bolts in through holes of the solar panels 210 and corresponding through holes in the outer shell of the respective fuselage portions 101a, 101b, 101c are used for mechanical fastening and in order to provide a possibility of electric contacting of the individual solar panels 210. By means of the contacting and fastening bolts the solar panels 210 are contacted electrically so as to furnish generator terminals. Thus, by fastening a multiplicity of solar panels 210 as a solar generator on the fuselage surface of the aircraft fuselage 101 of the aircraft 100 of FIG. 1, a multiplicity of generator terminals is furnished on the inner side of the aircraft fuselage. Electric contacting of the solar panels 210 or of the solar modules 201 to 206 may, of course, also be realized separately from mechanical fastening.

An alternative approach for the fastening described in the foregoing of the solar panels 210 or solar modules 201 to 206 on the outer shell of the aircraft fuselage 101 shall now be described. As is commonly known, composite materials are increasingly utilized for structural components of current aircraft, such as ribs, stringers, and planking (shell components). Composite materials essentially consist of a matrix material such as, e.g., a resin or synthetic material (e.g. polyester resin, vinyl ester resin or epoxy resin or the like) and a fiber material such as, e.g., fibers of glass, aramide, carbon, or the like. The matrix material that is capable of absorbing and passing on the pressure loads is reinforced with the fiber material which can predominantly absorb tensile stresses.

The presently proposed solar generator as a supplementary power supply may thus also be integrated directly as a functional layer into the outer surface of a shell component that is made of a composite material. I.e., as a result of such direct integration of the supplementary power supply in accordance with an embodiment of the invention into the outer shell, the outer shell of the aircraft fuselage constitutes a functional composite material having the added function of power generation.

If the supplementary power supply is thus integrated directly into the outer shell of the aircraft, fastening elements such as the fastening bolts for individual solar panels described in the foregoing are not required any more. The solar cells having, for instance, the form of the thin-film solar cells mentioned in the foregoing, may then be integrated directly into the fiber compound shell component together with the required terminals. The generator terminals may then also be routed to or provided on the inner side, i.e. the inside of the aircraft fuselage, and if necessary may in particular also be concentrated spatially in a particularly suitable location for simplified contacting.

By means of the generator terminals in accordance with an embodiment of the invention it is possible to furnish a multiplicity of different output voltages directly, i.e. without intermediate arrangement of converters or the like, through a corresponding selection of two respective ones of the generator terminals. Generator terminals may furthermore be selected and combined in accordance with the current irradiation situation (insolation intensity) of the solar cells. In other words, it is also fundamentally possible—as explained above in connection with the solar cells in a solar panel 210—to interconnect a multiplicity of solar panels 210 in series and/or parallel with each other so as to be able to furnish different voltages or different intensities of current each representing a multiple of the voltage or of the intensity of current of one solar panel 210.

The option of flexible configuration, particularly for the efficient utilization of the respective solar current that may be generated at a given moment while taking into account the current insolation intensity, is achieved with a control circuit as discussed in connection with FIGS. 3 and 4. This allows to configure virtually any required voltage, and to a certain extent also the respective intensity of current, "on the fly."

As was mentioned in the foregoing, the terminal voltage of a solar panel 210 is only slightly dependent on the current irradiation of light on the contained solar cells, while the current that may be drawn strongly depends on the actual insolation intensity. In other words, the point of maximum power (Maximum Power Point, MPP) as the optimum operating point of a solar panel 210 at which the product of terminal voltage and current is maximum at a particular irradiation situation, is influenced by the insolation intensity.

In currently known solar installations such as on roofs of houses, solar modules are operated in the MPP matching the current irradiation situation with the aid of an adaptation circuit, for example at the input of a inverter, with the adaptation circuit adapting the input resistance to the current MPP so as to follow the position of the MPP in correspondence with the irradiation situation.

An inverter customarily provides a required AC voltage on the output side for feeding consumers in the house or for feeding into a power supply network. The solar cells as the place of energy conversion from light to electric current are thus uncoupled from a consumer by means of the inverter. The inverter here ensures that the correct voltage and electricity is sufficiently available at its output to the required and possible extent.

In the onboard system of an aircraft such a inverter, or also converter, for furnishing the respective required voltage level amounts to additional complexity of circuitry and therefore additional ballast, which accordingly reduces the effectivity of the overall system due to its own consumption.

Figure 3:
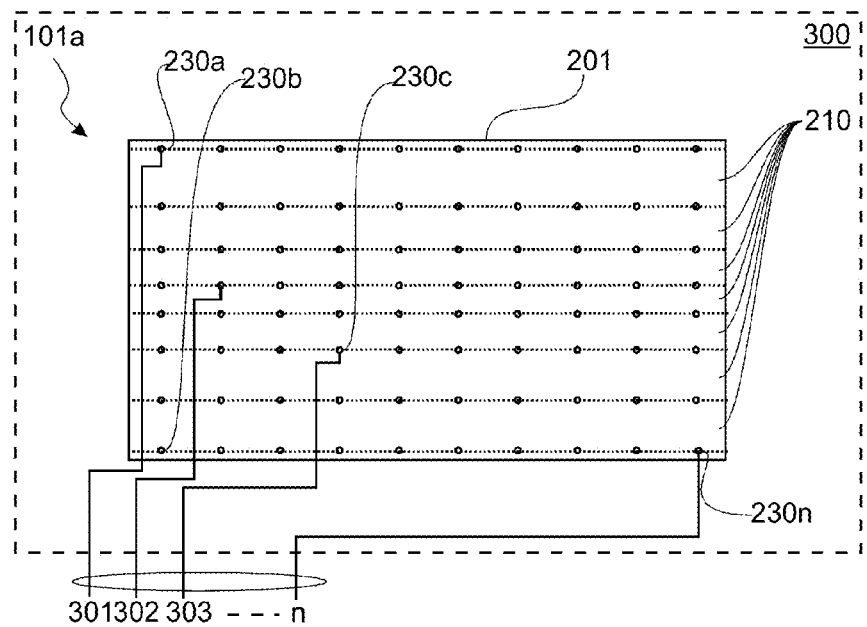
FIG. 3 is a top view of a solar module of a fuselage portion of FIG. 2 having several generator terminals.
Figure 4:
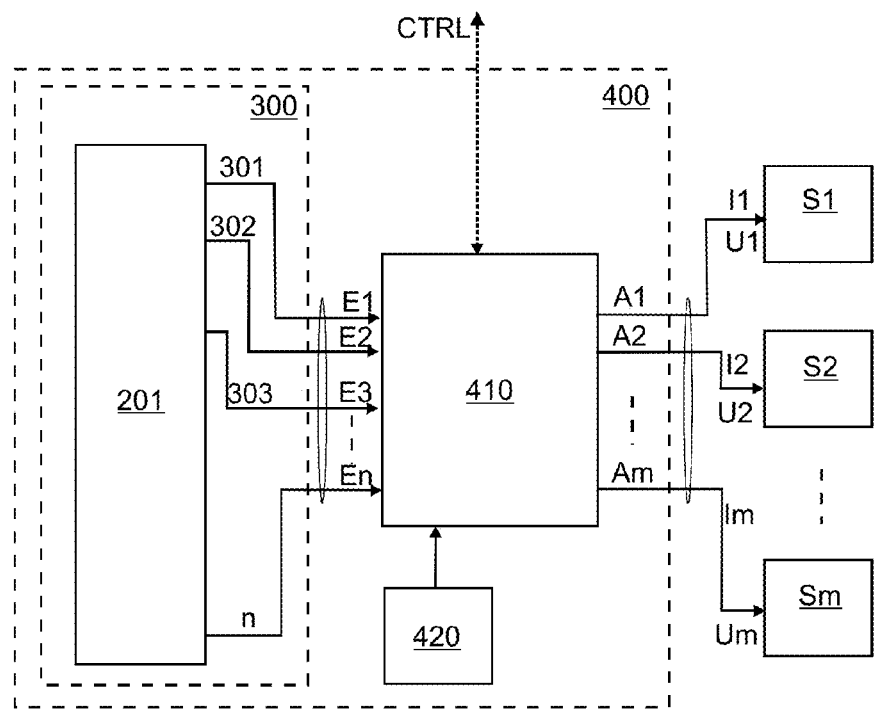
FIG. 4 is a block diagram of a supplementary power supply in accordance with an embodiment of the invention.

With reference to FIGS. 3 and 4 the particular configuration capability of a solar generator of various embodiments of the invention as already mentioned in the foregoing shall now be explained through a supplementary power supply that may be adapted to certain ohmic consumer systems of the aircraft 100.

FIG. 3 shows a schematic top view of the inside of a fuselage portion 101a of FIG. 2, on the outer side of which there is the solar module 201 formed of several solar panels 210. By means of a plurality of fastening elements configured as combined contacting and fastening bolts 230a, 230b, 230c and 230n, or corresponding terminals in the case of solar cells integrated into the outer shell, several generator terminals 301, 302, 303, . . . , n of a solar generator 300 of an embodiment of the invention are furnished as a supplementary power supply by cabling.

The generator terminals 301, 302, 303, . . . , n of the solar generator 300 are connected to terminal poles of the solar panels 210 of the solar module 201 in such a way that various voltage levels relative to a reference potential are brought about at the generator terminals 301, 302, 303, . . . , n when the solar module 201 is irradiated by sunlight or moonlight. By means of a suitable selection of two of these generator terminals 301, 302, 303, . . . , n it is possible to tap a specific output voltage, i.e. having a specific voltage quantity, in corresponding steps.

If one defines the generator terminal n as a reference potential (ground), for example, then a predetermined voltage is present between the ground and each other one of the generator terminals 301, 302, 303, . . . . I.e., if each one of the solar panels 210 is adapted for an output voltage of 6 V, then it is possible to tap a voltage of 42 V at the generator terminal 301, a voltage of 24 V at the generator terminal 302, and a voltage of 12 V at the generator terminal 303 relative to the generator terminal n. Between the generator terminals 301 and 303 a voltage of 30 V may be tapped. By correspondingly adapting and dimensioning the solar panels 210 and in a given case interconnecting the solar modules 201 to 206 among each other it is thus possible to generate higher voltages such as 230 V.

In accordance with the principle set forth above it is thus possible to generate different output voltages by suitably adapting the output voltage of the solar panels 210 and of correspondingly provided generator terminals 301, 302, 303, . . . , n of individual ones of the solar panels 210. The respective required output voltage may then be tapped between the appropriate two generator terminals 301, 302, 303, . . . , n. As the supply voltage levels required by the respective ohmic consumer systems are known, the supplementary power supply in accordance with various embodiments of the invention may, of course, be adapted accordingly.

Here it should be noted once again for the sake of completeness that it is also possible to set a certain current capacity in addition to the respective required output voltage in accordance with the principles explained further above, by corresponding parallel connection of several solar panels 210. In other words, by corresponding parallel connection of sufficient solar cells combined into groups in the units of solar panel 210 or solar module 201 to 206, it is correspondingly also possible to realize the required current capacity according to the current insolation intensity.

As a matter of fact, both the output voltages and the current capacities may always only be realized to a certain extent, i.e. in dependence on the current irradiation of the solar cells and the fundamentally systemic maximum current capacity of the existing solar cells. Therefore, when designing the overall system, the solar generator is adapted such that the supplementary power supply may generate the required output voltages/currents starting from a particular insolation intensity.

The generator terminals 301, 302, 303, . . . , n may also already be fixedly pre-configured for particular output voltages, for instance such as to be connected directly in a voltage-compatible manner to a respective one of the electric onboard consumer systems of the aircraft, for supplying it with electricity.

FIG. 4 now illustrates a supplementary power supply 400 in accordance with an embodiment of the invention where the solar generator 300 in accordance with the embodiment of the invention of FIG. 3 is connected to a control circuit 410 which furnishes particular output voltages U1, U2, . . . , Um at outputs A1, A2, . . . , Am under consideration of the actual insolation intensity, i.e. the presently available light amount and/or adjustable priorities. For the supplementary power supply 400 the control circuit 410 may, of course, also be connected to a solar generator formed by several ones of the solar modules 201 to 206 (cf. FIG. 2).

The control circuit 410 allows to configure and/or monitor the supplementary power supply via a corresponding control bus CTRL. Via the control bus CTRL the voltages U1, U2, . . . , Um at the outputs A1, A2, . . . , Am and the currents I1, I2, . . . , Im required there may be predetermined and set.

The control bus CTRL does, however, also allow to specify an order of priority to the effect of which ones of the outputs A1, A2, . . . , Am and thus which consumer systems S1, S2, . . . , Sm are to be supplied preferentially by the supplementary power supply, for example in accordance with the current operating condition of the aircraft, e.g. in flight, on the ground, or in an emergency. In other words, the electric power that can presently be generated by means of the solar generator may be supplied, in a situation-dependent manner, into the respective onboard network of the prioritized consumer system or of the prioritized consumer systems S1, S2, . . . , Sm in a voltage-compatible manner.

To this end the control circuit 410 has a plurality of inputs E1, E2, E3, . . . , En interconnected with the generator terminals 301, 302, 303, . . . , n, control inputs connected to the control bus CTRL, and at least one or also several output terminals A1, A2, . . . , Am that may in particular be interconnected, permanently or for respective specific time periods or in accordance with specific orders of priority, with ohmic consumer systems S1, S2, . . . , Sm present on the aircraft. In other words, in accordance with a respective demand or priority the solar generator 300 as the supplementary power supply supplies one or several or all of the consumer systems S1, S2, . . . , Sm with electric power.

By way of example and not conclusively, the following consumer systems S1, S2, . . . , Sm of the aircraft 100 are conceivable as practical examples for a vehicle including a supplementary power supply in accordance with an embodiment of the invention: fuel management, primary flight control, secondary flight control, braking systems, toilets and onboard kitchens, cabin air conditioning, and the like. In the above-mentioned consumer systems the following voltage levels are common: 28 V, 115 V, 230 V.

Figure 5:
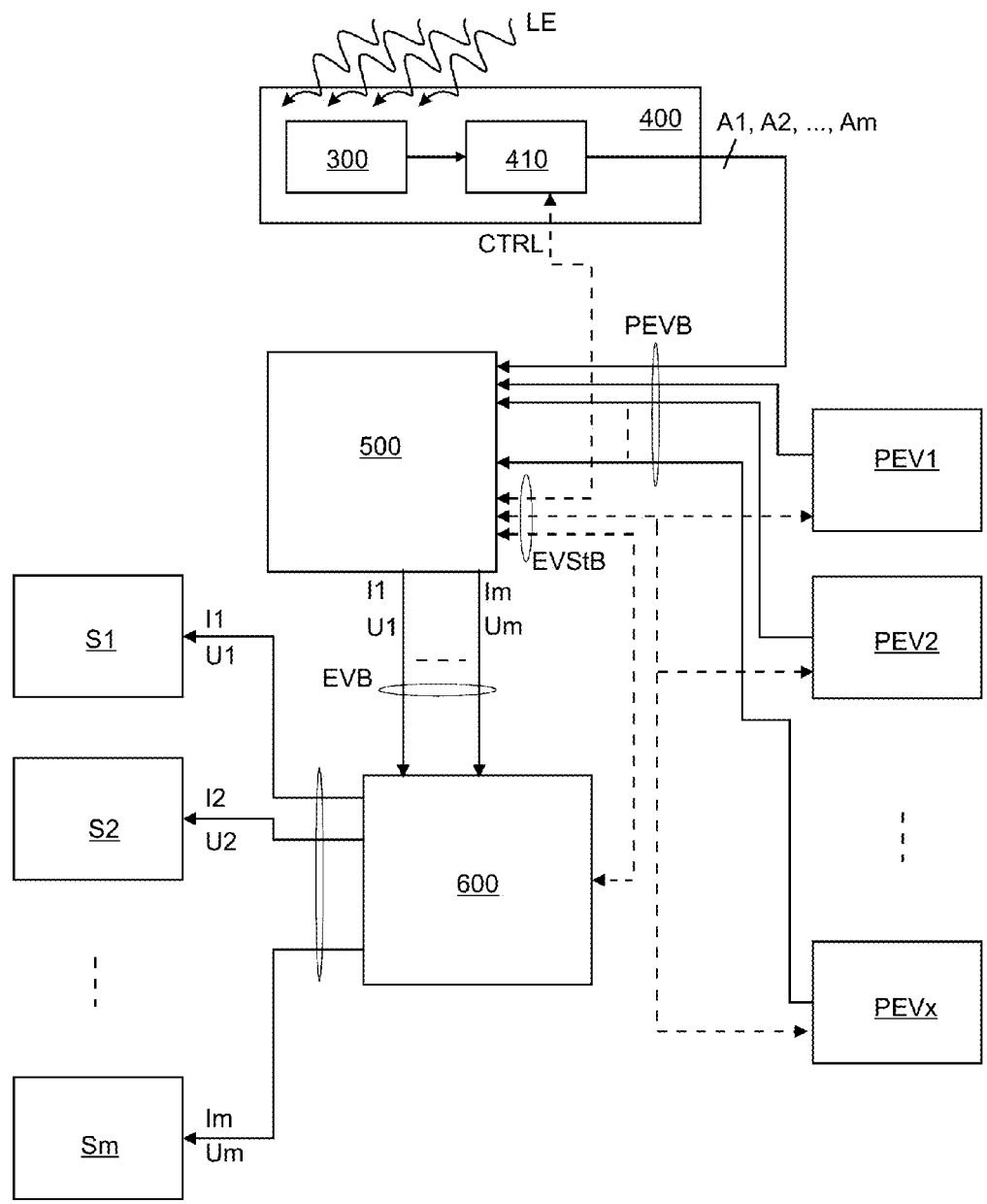
FIG. 5 is a block diagram of a power management system for the supply of electric consumer systems of a vehicle such as the aircraft of FIG. 1 by means of electric power from various power supply systems etc. of a supplementary power supply in accordance with the invention of FIG. 4.

FIG. 5 shows a block diagram of a power management system for supplying the various electric consumer systems S1, S2, . . . , Sm, for instance of the aircraft of FIG. 1, by means of electric power from different primary electricity supply systems PEV1, PEV2, . . . , PEVx and the supplementary power supply 400 of the embodiment of the invention of FIG. 4, whereby the amount of light energy LE that is correspondingly available at a respective existing insolation intensity may be converted to electric current.

By way of example there is in the aircraft of FIG. 1 a group of further primary power supply systems PEV1, PEV2, . . . , PEVx capable of furnishing electric power such as, for example, the primary generators of the aircraft 100 located in the engines 112a, 112b, batteries, the auxiliary power unit (APU), a ram air turbine (RAT), to mention several ones.

The supplementary power supply 400 in accordance with the embodiment of the invention that was already explained in connection with FIG. 4 contains the solar generator 300 and the control circuit 410 for configuring the supplementary power supply 400 in accordance with an embodiment of the invention. The control circuit 410 is configured for interconnecting the output terminals A1 to Am with the multiplicity of solar cells in correspondence with an actual intensity of insolation of the solar cells, such that the respective required nominal voltage (U1 to Um) and in particular the respective required nominal current (I1, I2, Im) are available at the output terminals A1 to Am in accordance with the settings via the control bus CTRL. To this end the control circuit 410 of the supplementary power supply 400 is configured to selectively connect or interconnect at least two of the generator terminals of the solar generator 300 with at least two input terminals, while the control circuit 410 may also be fixedly connected to the existing generator terminals via associated input terminals.

A power management module 500 is connected to the multiplicity of primary power generating systems PEV1, PEV2, . . . , PEVx and the supplementary power supply 400 in accordance with an embodiment of the invention. The power supply lines are represented in FIG. 5 in the form of a primary power supply bus PEVB.

Via a power supply control bus EVStB the power management module 500 is in connection with primary power generating systems PEV1, PEV2, . . . , PEVx and the supplementary power supply 400 of various embodiments of the invention. On the power supply control bus EVStB the power management module 500 retrieves the currently produced power or can adjust the latter in the scope of availability through corresponding control commands. For example, in the case of an aircraft that is stationary on the ground while exposed to intense insolation, it is possible to cover the power demand entirely or for the most part through the supplementary power supply 400, so that the APU only has to be operated at low power or not at all. In other words, the power management module 500 would draw the maximum power of the supplementary power supply 400 and throttle the APU operation correspondingly.

For a particularly efficient utilization of the electric power that may be furnished on the part of the supplementary power supply 400, the control circuit 410 is furthermore configured to only draw a nominal voltage at the solar generator 300 for which the currently required nominal current can also approximately be generated by the solar generator (300) at the actual intensity of insolation of the solar cells.

The power management module 500 is further connected to a power distribution unit 600 to which the voltages U1, U2, ..., Um and current I1, I2, ..., Im basically required in the aircraft are furnished. Via the power supply control bus EVStB the power management module 500 continuously retrieves the current power requirement of the aircraft, i.e. the electricity requirement of the individual consumer systems S1, S2, ..., Sm at the respective required voltages.

The power distribution unit 600 appropriately distributes the electric power to the consumer systems S1, S2, ..., Sm according to demand.

As the power management module 500 retrieves, i.e. knows, the current power output from all the primary power generators PEV1, PEV2, ..., PEVx on the one hand and from the supplementary power supply 400, it may correspondingly supply the energy flow from the supplementary power supply 400 to the power distribution unit 600 for a most efficient utilization possible of the solar energy, and may correspondingly throttle or assist other primary power generators PEV1, PEV2, ..., PEVx.

Depending on the operating condition of the aircraft 100, only certain ones of the primary power supply systems EV1, EV2, ..., EVx are available. Thus, electric power from the primary generators of the aircraft 100 and possibly from existing batteries and the auxiliary power unit (APU) will be available in (normal) flight operation. In emergency operation, the ram air turbine (RAT) furthermore supplies electric current in addition to the primary power supply systems of the flight operation that are then still operable in a given case. On the ground, the consumer systems may possibly be supplied with electricity from outside by means of a ground power unit (GPU), or by means of an air starter unit (ASU) in the event of a failure of the APU.

It results from the various operating states mentioned in the foregoing that on the one hand, power for meeting the power requirements to various extents is available which involves additional cost, particularly in the case of external supply. Apart from this, depending on the operating condition not all consumer systems are equally important, e.g. with a view to the safety of the aircraft that will always be paramount.

Different criteria apply to the above-described situation of a fully occupied aircraft waiting on the runway while exposed to intense insolation. In this case, e.g., cabin air conditioning and the operation of the toilets are more important than the onboard infotainment system. Here, various embodiments of the present invention offer not only the possibility of a particular efficient utilization—i.e., utilization with a high degree of efficiency—of the electric power supplied by means of a solar generator as a supplementary power supply, but also a prioritized distribution of the power to the consumer systems in a manner that is dependent on the situation.

The following table illustrates by way of example a possible prioritized distribution of the electric power from the supplementary power supply by referring to four different operational situations. The set of rules given here as an example may be implemented correspondingly in a software of the power management module 500 of FIG. 5 that may be configured to be programmable accordingly, in order to configure the power management module 500 as to which primary supplier(s) is/are to be substituted to what extent by the supplementary power supply 400, i.e. power from the solar generator 300.

TABLE

| Operational situation | Marginal condition | Action power management module |
|---|---|---|
| Aircraft's batteries empty or on low power level solar generator supplies high power | Engine not active aircraft on the ground APU not active no consumers reported by PDC | Power from solar generator utilized entirely for charging the batteries |
| Engine generator at low power output rising electricity consumption due to cabin infotainment system 10% additional power consumption prognosticated solar generator supplies 50% of maximum power | Aircraft in flight in "cruise mode" engine at low rpm rpm increase would amount to increased kerosene consumption | 10% of the power from solar generator supplied to the cabin infotainment system |
| Takeoff preparations on the ground early morning, sunrise solar generator begins to generate power | Engine not active aircraft on the ground APU active cabin systems active cockpit systems in "pre-flight mode" | Power from solar generator supplied to the PDC APU rpm throttled, with power generation throttled proportionally |

TABLE-continued

| Operational situation | Marginal condition | Action power management module |
|---|---|---|
| Aircraft batteries old but fully charged, extremely low environmental temperature favors incipient discharge night operation solar generator supplies minimum power of 3% from full-moon light | Engine not active aircraft on the ground APU not active no consumers reported by PDC | Power from solar generator utilized entirely for compensating battery discharge to preserve existing charge |

All conceivable scenarios are, of course, to be encompassed by system architecture and risk assessment so that situations likely to endanger the safety of the aircraft operation can not be brought about on account of the power management module 500.

Various embodiments of the present invention provide a particularly efficient utilization of the power from a supplementary power supply including a solar generator for ohmic consumers in a vehicle, in particular an aircraft of the practical example. The supplementary power supply is particularly well suited for self-sufficient systems—such as especially vehicles on account of their intended mobility—in order to utilize additional electricity from a solar generator as a supplementary power supply, which fluctuates in accordance with the actual intensity of insolation of the solar cells, as efficiently as possible in the vehicle in view of the vehicle's limited energy budget. This is achieved through the supplementary power supply of various embodiments of the invention in that at least one output terminal is interconnected with the solar cells of the solar generator in such a way that a nominal voltage for which the required nominal current can also be generated at the current irradiation is present at the at least one output terminal.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A supplementary power supply comprising a solar generator for ohmic consumers in a vehicle,
   wherein the vehicle is an aircraft, and wherein the solar generator is arranged at least on or in a part of the outer surface of the aircraft,
   wherein a control circuit is electrically connected to a multiplicity of solar cells via generator terminals of the solar generator and comprises at least one output terminal,
   wherein the at least one output terminal is connected or adapted to be selectively connected to a consumer system, and wherein the consumer system has associated to it a specific nominal voltage and a specific nominal current that corresponds to a momentary rate of utilization of the consumer system, wherein the consumer system includes at least one from the group of: fuel management, primary flight control, secondary flight control, braking systems, toilets and onboard kitchens, and cabin air conditioning, and wherein the specific nominal voltage includes at least one voltage from the group of: 28 V, 115 V, and 230 V, and
   wherein the control circuit interconnects the at least one output terminal with the multiplicity of solar cells such that a nominal voltage and a nominal current are available at the at least one output terminal, and wherein for a particular output current at a particular insolation intensity a corresponding number of solar cells is connected in parallel and for a particular output voltage a corresponding number of solar cells is connected in series.

2. The supplementary power supply according to claim 1, wherein every solar cell of the multiplicity of solar cells comprises at least two electric terminals, and
   wherein several ones of the electric terminals are connected with the generator terminals for providing one or several predetermined voltages between two respective ones of the said generator terminals.

3. The supplementary power supply according to claim 1, wherein groups of the solar cells are connected among each other by means of the electric terminals so as to form one or several units for respective predetermined output voltages, and
   wherein the generator terminals are connected at least to a part of the electric terminals of the one or several units.

4. The supplementary power supply according to claim 3, wherein the one or several units comprise solar panels and solar modules.

5. The supplementary power supply according to claim 1, wherein the control circuit is configured to selectively connect at least two of the generator terminals of the solar generator to at least two input terminals.

6. The supplementary power supply according to claim 1, wherein the control circuit is connected to the generator terminals via associated input terminals.

7. The supplementary power supply according to claim 1, wherein the control circuit is configured to interconnect the at least one output terminal for the specific nominal voltage and the specific nominal current with at least two of the generator terminals.

8. The supplementary power supply according to claim 1, wherein the control circuit comprises a voltage limiting function, which detects the actually available nominal current that can be generated at the actual intensity of insolation of the solar cells, and which only draws such a nominal voltage at the solar generator for which the respective required nominal current is available.

9. The supplementary power supply according to claim 1, wherein the aircraft comprises an aircraft fuselage having at least one fuselage portion and a fuselage surface; and
   wherein the at least one solar generator is arranged on the fuselage surface or integrated in the fuselage surface at least in the area of the back of the aircraft.

10. The aircraft according to claim 9, wherein the at least one solar generator is arranged on the fuselage surface or integrated in the fuselage surface at least in a predetermined sector angle of the back of the aircraft.

11. A supplementary power supply comprising a solar generator for ohmic consumers in a vehicle, wherein a control circuit is electrically connected to a multiplicity of solar cells via generator terminals of the solar generator and comprises at least one output terminal, wherein the at least one output terminal is connected or adapted to be selectively connected to a consumer system, and wherein the consumer system has associated to it a specific nominal voltage and a specific nominal current that corresponds to a momentary rate of utilization of the consumer system, wherein the control circuit further comprises at least one control input, wherein at least one of the at least one output terminal may be activated via the control input in accordance with a priority specification, wherein, based on a current operating condition of the vehicle, the priority specification renders the at least one consumer system selectable only if it belongs to a predetermined functional group, and wherein the control circuit interconnects the at least one output terminal with the multiplicity of solar cells such that a nominal voltage and a nominal current are available at the at least one output terminal, and wherein for a particular output current at a particular isolation intensity a corresponding number of solar cells is connected in parallel and for a particular output voltage a corresponding number of solar cells is connected in series.

12. The supplementary power supply according to claim 11, wherein the at least one control input comprises a bidirectional control bus.

* * * * *

UNITED STATES PATENT AND TRADEMARK OFFICE
CERTIFICATE OF CORRECTION

PATENT NO. : 9,318,625 B2
APPLICATION NO. : 13/536562
DATED : April 19, 2016
INVENTOR(S) : Sten Gatzke It is certified that error appears in the above-identified patent and that said Letters Patent is hereby corrected as shown below:

In the claims
column 16, line 12
replace "isolation"
with --insolation--.

Signed and Sealed this
Fourteenth Day of June, 2016

Michelle K. Lee
*Director of the United States Patent and Trademark Office*